United States Patent [19]

Sunami

[11] 4,210,993
[45] Jul. 8, 1980

[54] METHOD FOR FABRICATING A FIELD EFFECT TRANSISTOR

[75] Inventor: Hideo Sunami, Tokyo, Japan
[73] Assignee: Hitachi, Ltd., Japan
[21] Appl. No.: 8,837
[22] Filed: Feb. 2, 1979

Related U.S. Application Data

[63] Continuation of Ser. No. 806,531, Jun. 14, 1977, abandoned.

[30] Foreign Application Priority Data

Sep. 17, 1975 [JP] Japan .................................. 50-111622

[51] Int. Cl.$^2$ ............................................. B01J 17/00
[52] U.S. Cl. ........................................ 29/571; 29/578; 29/580; 357/23; 357/59
[58] Field of Search ........................... 29/571, 578, 580

[56] References Cited

U.S. PATENT DOCUMENTS

| | | | |
|---|---|---|---|
| 3,673,471 | 6/1972 | Klein | 29/571 |
| 3,798,752 | 3/1974 | Fujimoto | 29/571 |

OTHER PUBLICATIONS

Eletrochemical Society Extended Abstracts, May 7-11, 1972, Abstract #23, "Properties of Polycrystalline Films . . .", by Yasuda.
IBM Technical Bulletin, vol. 17, #9, Feb. 1975, "Self-Aligned FET Gate Process", by Lee, p. 2591.

Primary Examiner—W. C. Tupman
Attorney, Agent, or Firm—Craig and Antonelli

[57] ABSTRACT

A field effect transistor is fabricated by forming a silicon dioxide film having a region where said silicon dioxide film becomes thinner at that area on one surface of a silicon semiconductor substrate of a first conductivity type at which the field effect transistor is to be formed. On said silicon dioxide film there is deposited a polycrystalline silicon layer which has an impurity concentration higher than that of the silicon semiconductor substrate. The polycrystalline silicon layer is removed by selective etching so as to leave only a part which becomes a gate of the field effect transistor. A surface part of the silicon dioxide film over the entire area is removed by employing as a mask the part of the polycrystalline silicon layer to become the gate and to the extent that the surface of the silicon semiconductor substrate is exposed at the other part in the region, a silicon dioxide film is grown by thermally oxidizing the whole surface of the polycrystalline silicon layer to become the gate and the exposed surface of the semiconductor substrate, the silicon dioxide film produced at the surface of the polycrystalline silicon layer being thicker than the silicon dioxide film produced at the exposed surface of the semiconductor substrate. Windows for a source and drain are formed by removing the silicon dioxide films over the entire area by such thickness that the surface of the silicon semiconductor substrate is exposed at the part in the region other than the part covered by the polycrystalline silicon layer to become the gate, but so that the polycrystalline silicon layer is not exposed; the source and the drain are formed by doping surface portions of the semiconductor substrate with an impurity of a second conductivity type opposite to the first conductivity type through the windows formed by the preceding step; removing a part of the silicon dioxide film is removed by selective etching so as to expose a part of the polycrystalline silicon layer. An electric conductor is deposited over the entire area, and finally the electric conductor is formed into a predetermined pattern by selective etching so as to obtain source, gate and drain electrodes.

7 Claims, 8 Drawing Figures

METHOD FOR FABRICATING A FIELD EFFECT TRANSISTOR

This is a continuation of application Ser. No. 806,531, filed June 14, 1977, now abandoned.

BACKGROUND OF THE INVENTION

1. Field of the Invention

This invention relates to a method for fabricating a field effect transistor, particularly a self-alignment type field effect transistor.

2. Description of the Prior Art

The field effect transistor to be formed by self alignment has hitherto been fabricated by forming a silicon dioxide film having region where the silicon dioxide film becomes thinner at that area on one surface of a silicon semiconductor substrate of a first conductivity type at which the field effect transistor is to be formed, depositing on the silicon dioxide film a polycrystalline silicon layer which has a high impurity concentration, removing the polycrystalline silicon layer by selective etching so as to leave only a part which becomes a gate of the field effect transistor, removing a surface part of the silicon dioxide film over the entire area by employing as a mask the part of the polycrystalline silicon layer to become the gate and, to the extent that the surface of the silicon semiconductor substrate is exposed at the other part in the region, forming a source and a drain by doping substrate surface portions thus exposed with an impurity of a second conductivity type opposite to the first conductivity type of the semiconductor substrate, forming a silicon dioxide film on the entire area which includes a surface of the polycrystalline silicon layer to become the gate and the exposed surface of said semiconductor substrate, forming windows for source, drain and gate electrodes in the silicon dioxide film, depositing a metallic conductor over the entire area, and forming said metallic conductor into a predetermined pattern by selective etching so as to obtain the source, drain and gate electrodes. According to such a method, in order to prevent the source and drain electrodes from overlying the polycrystalline silicon layer serving as the gate, in the selective etching step of forming connection holes for the electrodes, the interval between each of the connection holes for the source and drain electrodes and the polycrystalline silicon layer serving as the gate is selected, at the present technical level, to be at least $3\mu m$ in consideration of the magnitude of the side etching of the connection hole and the reproducbility of the mask registration. For this reason, the prior art has had the disadvantage that a high density of integration cannot be attained.

SUMMARY OF THE INVENTION

An object of this invention is to provide a method for fabricating a self alignment type field effect transistor which is free from the above-mentioned disadvantage and with which the interval between a polycrystalline silicon layer being a gate and each of the connection holes for source and drain electrodes can be made small, so that a high density of integration is attainable.

The method for fabricating a field effect transistor according to this invention for accomplishing the object comprises the steps of forming a silicon dioxide film having a region where said silicon dioxide film becomes thinner at that area on one surface of the silicon semiconductor substrate of a first conductivity type at which the field effect transistor is to be formed; depositing on the silicon dioxide film a polycrystalline silicon layer which has an impurity concentration higher than that of the silicon semiconductor substrate; removing the polycrystalline silicon layer by selective etching so as to leave only a part which becomes a gate of the field effect transistor; removing a surface part of the silicon dioxide film over the entire area by employing as a mask the part of the polycrystalline silicon layer to become the gate and to the extent that the surface of the silicon semiconductor substrate is exposed at the other part in the region; growing a silicon dioxide film by thermally oxidizing the whole surface of the polycrystalline silicon layer to become the gate and the exposed surface of the semiconductor substrate, the silicon dioxide film produced at the surface of the polycrystalline silicon layer being thicker than the silicon dioxide film produced at the exposed surface of the semiconductor substrate; forming windows for a source and a drain by removing the silicon dioxide films over the entire area by such a thickness that the surface of the silicon semiconductor substrate is exposed at the part in the region other than the part covered with the polycrystalline silicon layer to become the gate, but that the polycrystalline silicon layer is not exposed; forming the source and the drain by doping surface portions of the semiconductor substrate with an impurity of a second conductivity type opposite to the first conductivity type through the windows formed by the preceding step; removing a part of the silicon dioxide film by selective etching so as to expose a part of the polycrystalline silicon layer; depositing an electric conductor over the entire area; and forming the electric conductor into a predetermined pattern by selective etching, thereby to form source, gate and drain electrodes.

As described above, according to this invention, the intervals between the source and drain electrodes and the polycrystalline silicon layer being the gate are established by exploiting the difference in the rate of forming silicon dioxide by the thermal oxidation due to the difference of the impurity concentrations in silicon. Therefore, even the interval which is as small as 0.1 $\mu m$ can be readily established, and a high density of integration can be attained.

Other features and advantages of this invention will become more apparent from the following embodiments explained with reference to the drawing. The embodiments, however, are given for elucidation only and can of course have various modifications and alterations without departing from the spirit and scope of this invention.

DESCRIPTION OF THE PREFERRED EMBODIMENTS

Example 1

Figure 1:
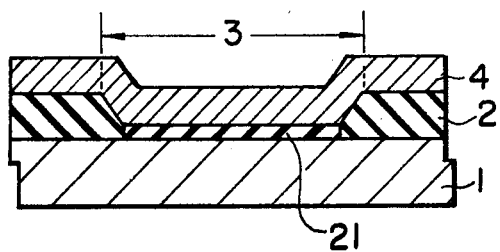
FIGS. 1 to 6 are sectional views which show manufacturing steps according to a method of this invention for fabricating a field effect transistor.
Figure 2:
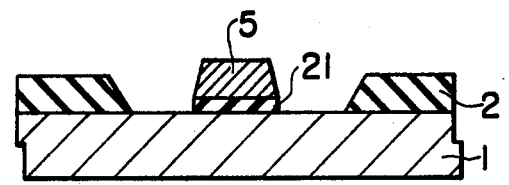
Figure 3:
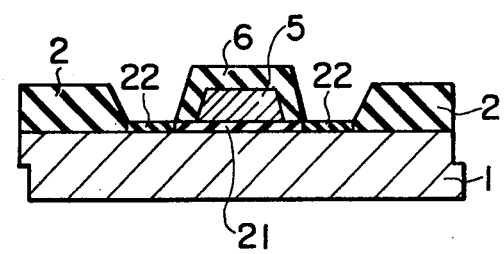
Figure 4:
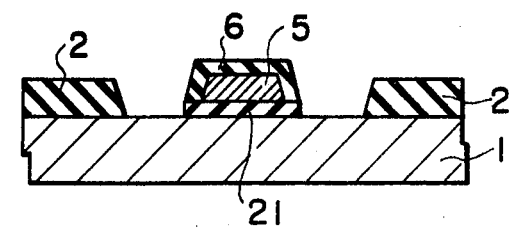

As shown in FIG. 1, a field insulating film 2 which is made of $SiO_2$ and which is 0.5-1.5 $\mu m$ thick is formed on the entire area of the (1 0 0) surface of a p-type silicon substrate 1 which has an impurity concentration of $10^{14}$–$10^{17}$ cm$^{-3}$ or so. By way of example, when the silicon substrate is oxidized in an atmosphere of wet O$_2$ at 1,000° C. for 6 hours, a SiO$_2$ film having a thickness of 1 μm is formed. Thereafter, the field insulating film at an area 3 at which a transistor is to be formed is etched and removed by the well-known photolithographic method. Here, a first photo mask is employed. A gate insulating film 21 whose thickness is 0.05–0.1 μm or so is formed at the area 3 by the thermal oxidation again. Using the chemical vapor deposition method, a polycrystalline silicon layer 4 is formed to a thickness of 0.2–0.5 μm so as to cover the entire area of the field insulating film 2 as well as the gate insulating film 21. The polycrystalline silicon layer 4 is previously doped with phosphorus or boron at a high concentration over about $10^{20}$ cm$^{-3}$ by, for example, a known thermal diffusion process. With the thermal diffusion employing POCl$_3$, when the diffusion is carried out at 1,000° C. for 30 minutes, the polycrystalline silicon layer of 0.3 μm exhibits a sheet resistance of about 30Ω/□ and the concentration of electrically active phosphorus becomes $10^{20}$–$10^{21}$ cm$^{-3}$. As is shown in FIG. 2, the polycrystalline silicon layer 4 is removed by the photolithographic method so as to leave a polycrystalline silicon layer 5 to become the gate of the transistor and a polycrystalline silicon layer (not shown in the figure) on the field insulating film 2 to be used as an interconnection layer later. Here, a second photo mask is employed. Using as a mask the polycrystalline silicon layer 5 to become the gate, the exposed parts of the gate insulating film 21 and the surface portion of the field insulating film 2 are removed with an etchant of, for example, buffered HF solutions to the extent that the surface of the silicon semiconductor substrate 1 is exposed at that portion of the area 3 to form the transistor thereat which is not covered with the mask. Thereafter, the resultant substrate is oxidized in O$_2$ containing water vapor. Then, as shown in FIG. 3, an insulating film 22 of SiO$_2$ is formed on the silicon substrate 1, and a gate protective film 6 of SiO$_2$ is formed on the polycrystalline silicon layer 4. In general, the oxidation rate increases as the impurity concentration becomes higher. With the measure described above, therefore, the gate protective film 6 is formed more thickly than the insulating film 22. By way of example, when the oxidation is executed at 800° C. for 4 hours, the SiO$_2$ film of 580 nm is formed on the polycrystalline silicon layer 5 to become the gate, and the SiO$_2$ film of 180 nm on the exposed surface of the silicon substrate 1. Although the temperature for the thermal oxidation is not restricted to 800° C., the difference of the thicknesses of the SiO$_2$ films owing to the difference of the impurity concentrations is greater as the temperature becomes lower, and hence, a lower temperature is more advantageous for the performance of this invention. However, when the temperature for the thermal oxidation is excessively low, the period of time required for the thermal oxidation is too long, which creates a problem from the industrial point of view. In practice, the temperature for the thermal oxidation in accordance with this invention lies between 600° C. and 900° C. on the assumption that the oxidizing ambient pressure is under 1 atm. In general, the oxidation rate becomes greater with increasing ambient pressure, and the oxidation period of time can be made shorter for a predetermined thickness. Subsequently, as is shown in FIG. 4, the insulating film 22 as well as surface parts of the gate protective film 6 and the field insulating film 2 are removed again with an etchant of, for example, buffered HF solutions to the extent that the surface of the silicon semiconductor substrate 1 is exposed at that portion of the area 3 to form the transistor thereat which is not covered with the polycrystalline silicon layer to become the gate. That is, the SiO$_2$ films 2, 22 and 6 have the thicknesses reduced uniformly by 180 nm. The gate insulating film 6 still remains though the thickness decreases to 400 nm. Since the etchant which is a mixed solution consisting of 6 volumetric parts of NH$_4$F and 1 volumetric part of HF exhibits an etching rate of about 80 nm/min at the room temperature, the foregoing etching requires about 2 minutes.

Figure 5:
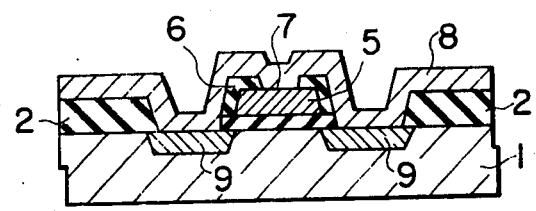

Thereafter, as is shown in FIG. 5, an electrode connecting hole 7 is formed in the gate protective film 6 by the photolithographic method. Here, a third photo mask is employed. A second electrode layer 8 which is made of a metal such as Al or polycrystalline silicon is deposited over the entire area to a thickness of 0.5–1 μm. In the case where the polycrystalline silicon is used for second electrode layer 8, n-type source and drain regions 9 can be formed either by implanting ions through the polycrystalline silicon or by thermally diffusing impurities with which the polycrystalline silicon is previously doped. It is a matter of course that, as in the prior art method for fabricating the MOS transistor, regions 9 to become the source and drain of the transistor can be formed by the thermal diffusion process or the ion implantation process in advance before the second electrode layer 8 is deposited. By way of example, with the thermal diffusion employing POCl$_3$, an n-type layer about 1 μm thick can be formed at 1,000° C. for 20 minutes. Although, in the process above, the n-type source and drain are formed in the p-type semiconductor substrate 1, the source and drain to be formed are, of course, of the p-type in the converse case of employing an n-type semiconductor substrate.

Figure 6:
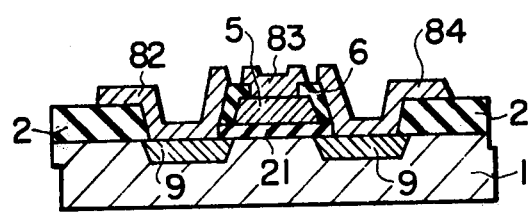

Further, as is shown in FIG. 6, the photoetching step for forming a source electrode 82, a gate electrode 83 and a drain electrode 84 is thereafter carried out to complete the semiconductor device. Here, a fourth photo mask is required.

According to this invention, as thus far set forth, the MOS transistor can be formed by employing, in principle, the four masks in total. In the prior art method for fabricating the MOS transistor employing the silicon gate, the n-type regions 9 and the device region 3, which is surrounded by the gate electrode 5 and the field oxide film 2, are formed by the self alignment. In addition to this feature of the prior art, both the drain electrode 84 and the source electrode 82 are self-aligned with the n-type regions 9. Therefore, the mask registration allowance already referred to in the description of the prior art is not necessary at the formation of these parts. This is remarkably effective for the miniaturization of the device.

Example 2

Figure 7:
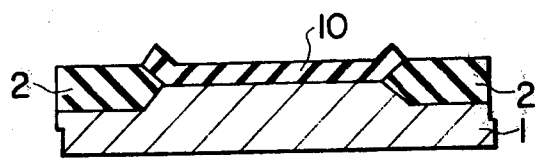
FIGS. 7 and 8 are sectional views which show manufacturing steps according to another aspect of performance of this invention.

In Example 1, after forming the field oxide film 2 over the entire area, the device area is formed by the etching. In the present embodiment, an Si$_3$N$_4$ film 10 is once formed on whole surface of the semiconductor substrate 1. As illustrated in FIG. 7, it is etched and removed so as to leave only a part lying at the area 3 at which the transistor is to be formed. Using the remaining Si$_3$N$_4$ film as a mask, the surface of the semiconductor substrate is thermally oxidized. Then, a part of the thickness of the field insulating film 2 is buried in the semiconductor substrate 1. Therefore, the transistor having a flatter surface than the transistor of Example 1 can be obtained. This process is known under the designation of LOCOS (local oxidation of silicon).

Figure 8:
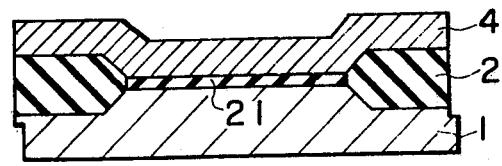

As is illustrated in FIG. 8, after removing the Si₃N₄ film 10, the gate insulating film 21 is formed and the polycrystalline silicon layer 4 is formed over the entire area of the field insulating film 2 as well as the gate insulating film 21 in the same way as in Example 1. The sectional view of FIG. 8 is similar to that of FIG. 1 except that the part of the thickness of the field insulating film 2 is buried in the semiconductor substrate 1. By quite the same subsequent steps as in Example 1, a transistor with the flat surface can be fabricated.

While, in the above description of this invention, the examples employing the silicon substrate of surface (1 0 0) are mentioned, the surface (1 1 1), the surface (1 1 0) and any other surfaces can be similarly employed. In the latter case, the oxidation rate differs slightly, and suitable oxidation conditions may therefore be preset.

What is claimed is:

1. A method for fabricating a field effect transistor, comprising the steps of:

forming a silicon dioxide film having a region where said silicon dioxide film becomes thinner at that area on one surface of a silicon semiconductor substrate of a first conductivity type at which the field effect transistor is to be formed, depositing on said silicon dioxide film a polycrystalline silicon layer which has an impurity concentration higher than that of said silicon semiconductor substrate, removing said polycrystalline silicon layer by selective etching so as to leave only a part which becomes a gate of said field effect transistor, removing a surface part of said silicon dioxide film over the entire area by employing as a mask said part of said polycrystalline silicon layer to become said gate and to the extent that the surface of said silicon semiconductor substrate is exposed at the other part in said region, simultaneously growing a silicon dioxide film on said exposed surface of said semiconductor substrate and said polycrystalline silicon layer to become said gate by thermally oxidizing the whole surface of said polycrystalline silicon layer to become said gate and the exposed surface on said semiconductor substrate, the silicon dioxide film thickness produced at said surface of said polycrystalline silicon layer being formed at a faster rate than the thickness at the exposed surface of said semiconductor substrate due to the higher impurity concentration of said polycrystalline silicon layer, whereby the silicon dioxide film produced at said surface of said polycrystalline silicon layer is thicker than the silicon dioxide film produced at said exposed surface of said semiconductor substrate, forming windows for a source and a drain by removing said silicon dioxide films over the entire area by such thickness that said surface of said silicon semiconductor substrate is exposed at the part in said region other than said part covered by said polycrystalline silicon layer to become said gate, but that said polycrystalline silicon layer is not exposed due to the greater thickness of the silicon dioxide film on said polycrystalline silicon layer, forming the source and the drain by doping surface portions of said semiconductor substrate with an impurity of a second conductivity type opposite to said first conductivity type through the windows formed by the preceding step, removing a part of said silicon dioxide film by selective etching so as to expose a part of said polycrystalline silicon layer, depositing an electric conductor over the entire area, and forming said electric conductor into a predetermined pattern by selective etching, thereby to form source, gate and drain electrodes.

2. A method for fabricating a field effect transistor according to claim 1, wherein the step of forming a silicon dioxide film having a region where said silicon dioxide film becomes thinner at that area on one surface of a silicon semiconductor substrate of a first conductivity type at which the field effect transistor is to be formed comprises the steps of forming a silicon nitride film on the entire area of said one surface of said silicon semiconductor substrate of said first conductivity type; removing said silicon nitride film so as to leave only a part lying at said area at which said field effect transistor is to be formed; forming a thick silicon dioxide film by thermally oxidizing a surface portion of said silicon semiconductor substrate by employing as a mask the silicon nitride film left by the preceding step; removing the remaining silicon nitride film; and forming a thin silicon dioxide film by thermally oxidizing a surface portion of said silicon semiconductor substrate as exposed by the preceding step.

3. A method for fabricating a field effect transistor according to claim 1, wherein said silicon semiconductor substrate has an impurity concentration of $10^{14}$ to $10^{17}$ cm$^{-3}$, and said polycrystalline silicon layer to become said gate has an impurity concentration of at least $10^{20}$ cm$^{-3}$.

4. A method for fabricating a field effect transistor according to claim 1, wherein the step of growing silicon dioxide films by thermally oxidizing a surface of said polycrystalline silicon layer to become said gate and the exposed surface of said semiconductor substrate is carried out in an oxidizing ambient containing water vapor at a temperature between 600° C. and 900° C.

5. A method for fabricating a field effect transistor according to claim 1, wherein the windows for a source and a drain are formed by simultaneously removing a substantially equal thickness of all of said silicon dioxide films.

6. A method for fabricating a field effect transistor according to claim 1, wherein the windows for a source and a drain are formed by removing said silicon dioxide films by etching.

7. A method for fabricating a field effect transistor according to claim 5, wherein the simultaneous removing of a substantially equal thickness of all of said silicon dioxide films is achieved by etching the silicon dioxide films.

* * * * *